(12) United States Patent
Tonkin et al.

(10) Patent No.: US 9,864,353 B2
(45) Date of Patent: Jan. 9, 2018

(54) FLOW BALANCING FOR A WELL

(71) Applicant: Schlumberger Technology Corporation, Sugar Land, TX (US)

(72) Inventors: Trevor Graham Tonkin, Abingdon (GB); Varma Gottumukkala, Missouri City, TX (US); Vadim Blekhman, Bellaire, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 389 days.

(21) Appl. No.: 14/742,984

(22) Filed: Jun. 18, 2015

(65) Prior Publication Data

US 2016/0369590 A1    Dec. 22, 2016

(51) Int. Cl.
*G06F 17/50* (2006.01)
*G05B 15/02* (2006.01)
*E21B 43/12* (2006.01)

(52) U.S. Cl.
CPC ............ *G05B 15/02* (2013.01); *E21B 43/12* (2013.01); *G06F 17/5009* (2013.01)

(58) Field of Classification Search
USPC .............................. 703/2, 10; 700/282; 702/6
See application file for complete search history.

(56) References Cited

U.S. PATENT DOCUMENTS

| | | | | |
|---|---|---|---|---|
| 2007/0168056 A1* | 7/2007 | Shayegi | ............... | G05B 13/048 700/48 |
| 2012/0095603 A1* | 4/2012 | Rashid | .................... | E21B 43/00 700/282 |
| 2014/0156238 A1* | 6/2014 | Rashid | .................... | E21B 43/00 703/2 |
| 2014/0358511 A1* | 12/2014 | Waage | .................. | G01V 11/00 703/10 |
| 2015/0015412 A1* | 1/2015 | Abbassian | .............. | E21B 44/00 340/854.4 |
| 2015/0053483 A1* | 2/2015 | Mebane, III | ............ | E21B 44/00 175/26 |

(Continued)

OTHER PUBLICATIONS www.EPmag.com, "Offshore Logistics" Jan. 2009, 41 pages.

(Continued)

*Primary Examiner* — Thai Phan

(57) ABSTRACT

Flow balancing includes selecting, for each down hole flow control valve of a well, a transformed well performance curve corresponding to a first down hole flow control valve pressure to obtain transformed well performance curves. The well includes a lateral including the down hole flow control valves. Using a constraint set that includes a balancing condition for the lateral, a network optimization analysis is performed on the transformed well performance curves to generate a set of choke positions corresponding to each down hole flow control valve. Network modeling of the well is performed based on the set of choke positions to obtain a second down hole flow control valve pressure for each down hole flow control valve. Using the set of choke positions, a field operation is performed for the well based on the second down hole flow control valve pressure being within a threshold difference of the first down hole flow control valve pressure for each down hole flow control valve.

20 Claims, 9 Drawing Sheets

(56) References Cited

U.S. PATENT DOCUMENTS

2015/0315903 A1* 11/2015 Abbassian .............. E21B 47/06
          702/6
2016/0053605 A1*  2/2016 Abbassian .............. E21B 44/00
          702/6
2016/0054713 A1*  2/2016 Foss ........................ E21B 43/00
          700/282

OTHER PUBLICATIONS

Dyer, S., et al., "Intelligent Completions—A Hands-Off Management Style", Mar. 31-Apr. 3, 2007, 14 pages.
Montaron, B., et al., "Intelligent Completions", 2007, 9 pages.
PCT/US2014/031539 International Search Report, Oct. 2, 2014.

* cited by examiner

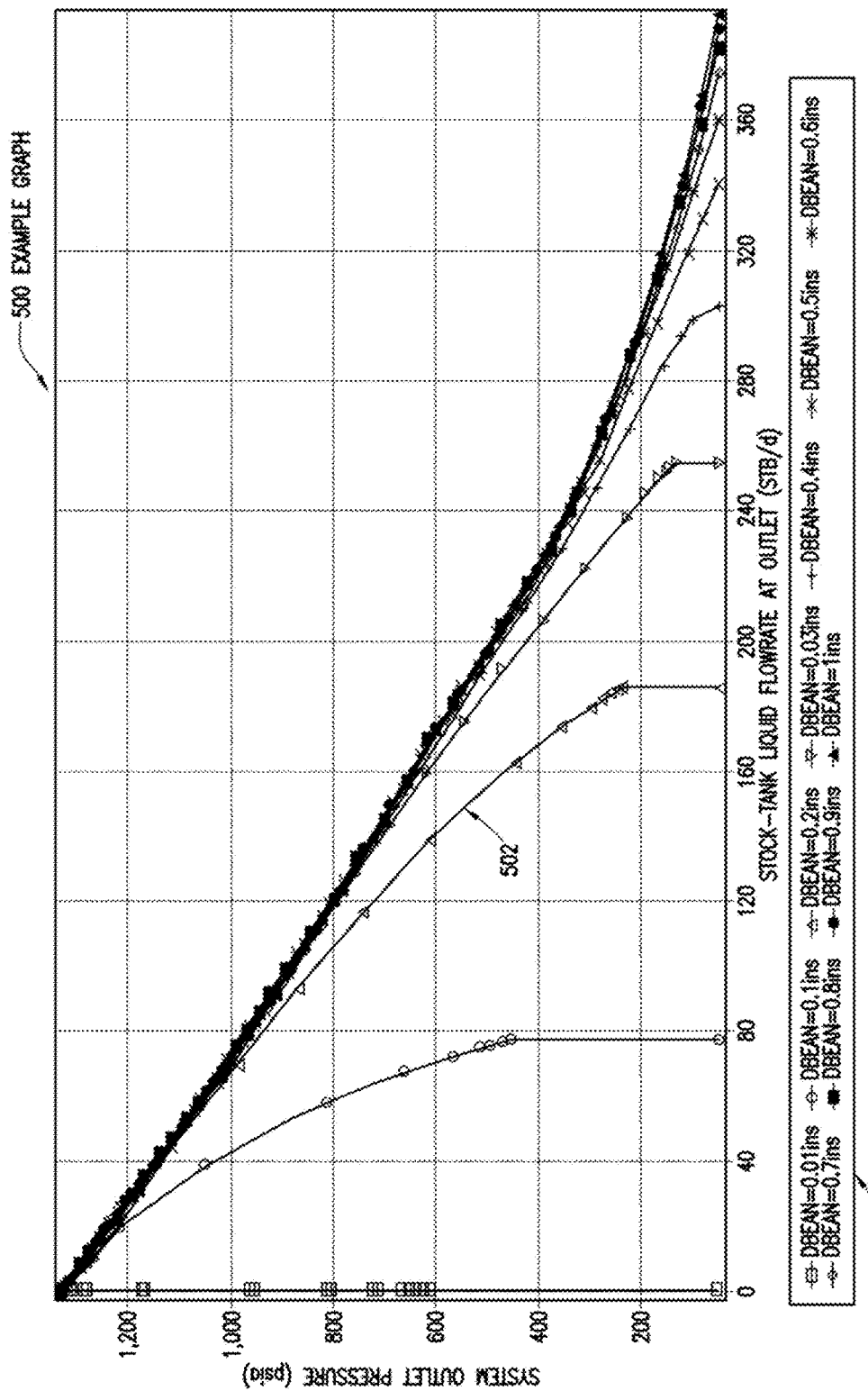
FIG. 5.1

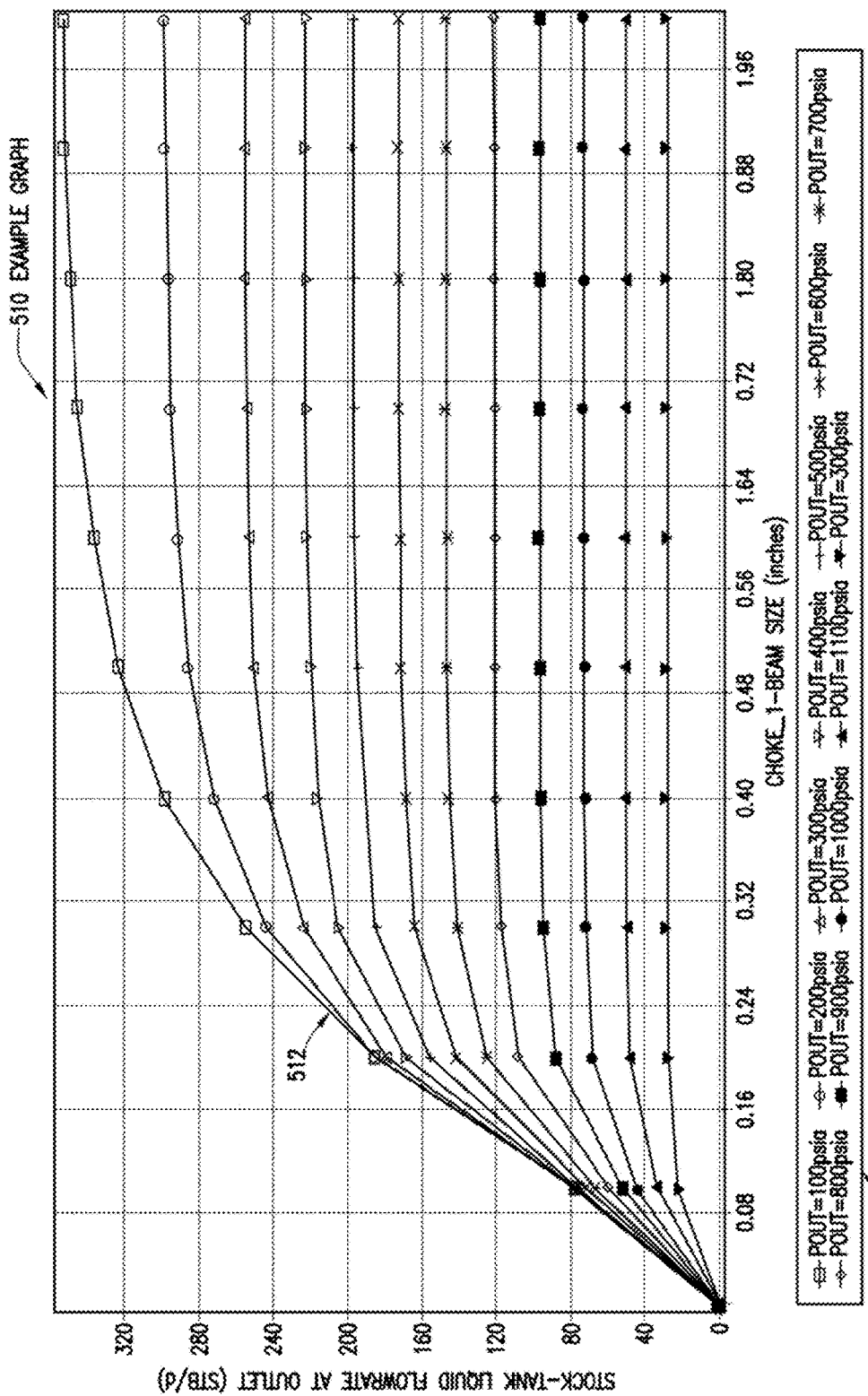
FIG. 5.2

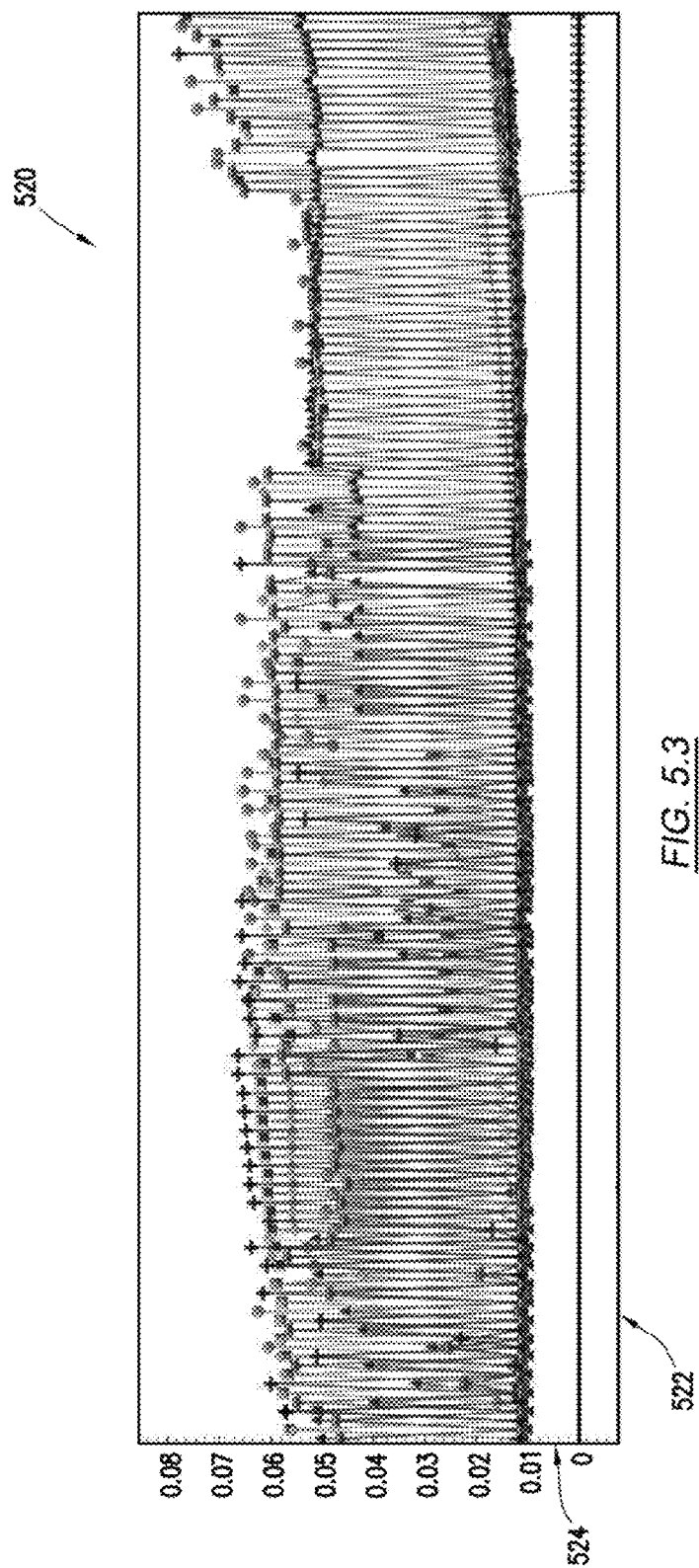
FIG. 5.3

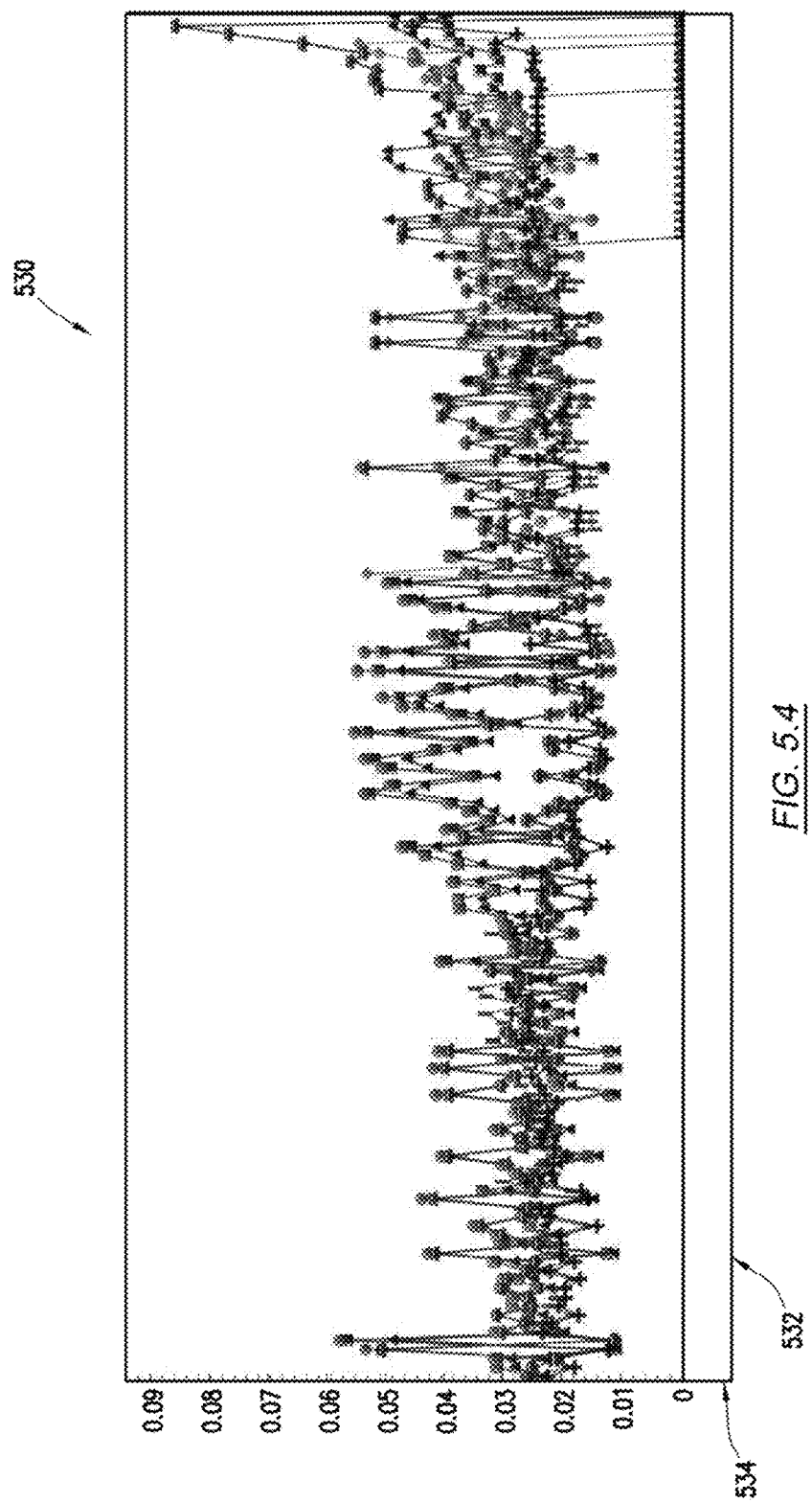
FIG. 5.4

FLOW BALANCING FOR A WELL

BACKGROUND

Hydrocarbon fluids such as oil and natural gas are obtained from a subterranean geologic formation, referred to as a reservoir, by drilling a well that penetrates the hydrocarbon-bearing formation. Once a wellbore is drilled, various forms of well completion components may be installed to control and enhance the efficiency of producing various fluids from the reservoir. One piece of equipment which may be installed is a down hole flow control valve.

SUMMARY

In general, one or more embodiments are directed to flow balancing that includes selecting, for each down hole flow control valve of a well, a transformed well performance curve corresponding to a first down hole flow control valve pressure to obtain transformed well performance curves. The well includes a lateral and the lateral includes the down hole flow control valves. Using a constraint set that includes a balancing condition for a lateral, a network optimization analysis is performed on the transformed well performance curves to generate a set of choke positions corresponding to each down hole flow control valve. Network modeling of the well is performed based on the set of choke positions to obtain a second down hole flow control valve pressure for each down hole flow control valve. Using the set of choke positions, a field operation is performed for the well based on the second down hole flow control valve pressure being within a threshold difference of the first down hole flow control valve pressure for each down hole flow control valve.

Other aspects of the technology will be apparent from the following description and the appended claims.

BRIEF DESCRIPTION OF DRAWINGS

Certain embodiments of the disclosure will hereafter be described with reference to the accompanying drawings, wherein like reference numerals denote like elements. It should be understood, however, that the accompanying figures illustrate the various implementations described herein and are not meant to limit the scope of various technologies described herein.

FIGS. 5.1, 5.2, 5.3, and 5.4 show an example in accordance with one or more embodiments of the technology.

DETAILED DESCRIPTION

Figure 1:
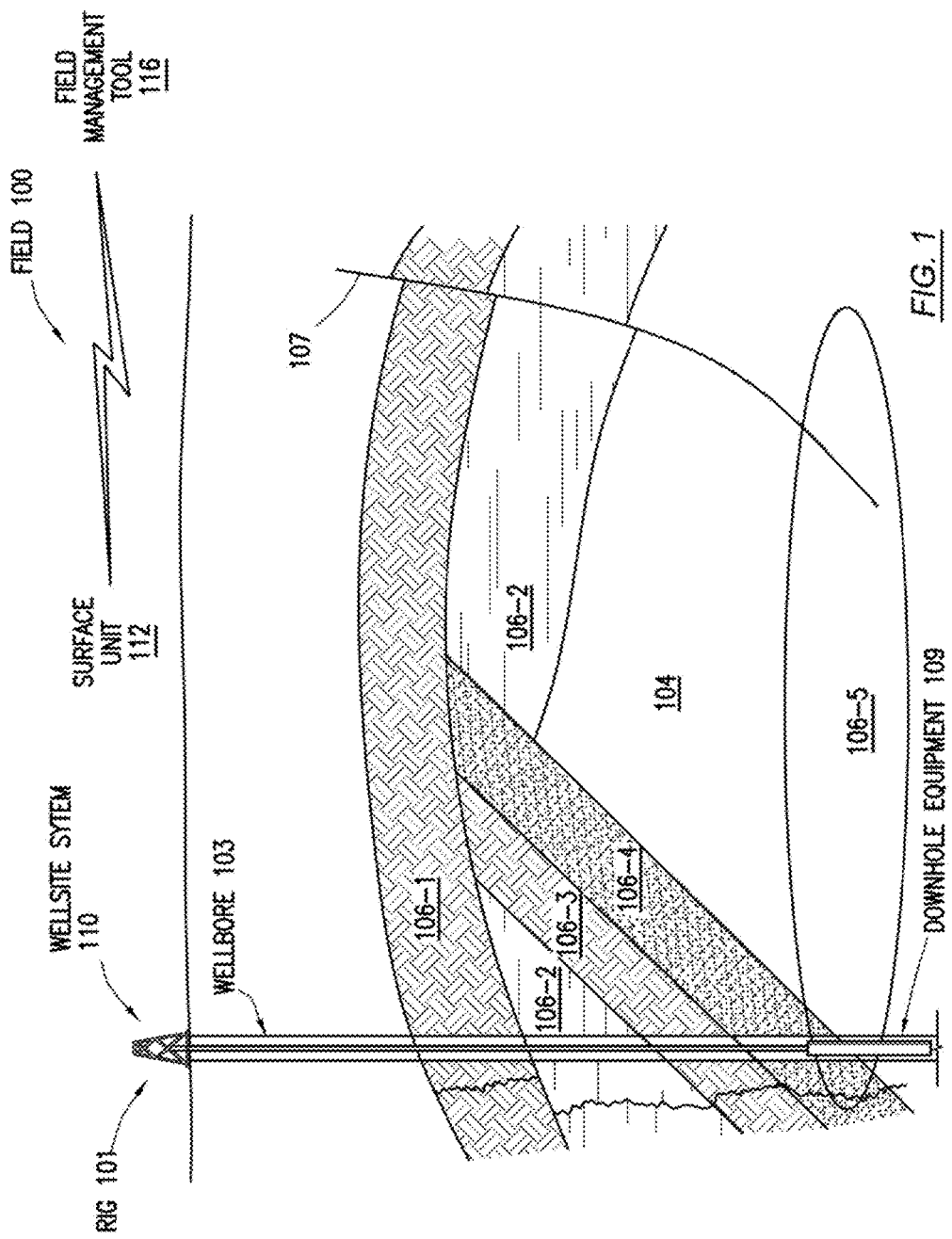
FIGS. 1, 2, and 3 show schematic diagrams in accordance with one or more embodiments of the technology.

Specific embodiments of the technology will now be described in detail with reference to the accompanying figures. Like elements in the various figures are denoted by like reference numerals for consistency.

In the following detailed description of embodiments of the technology, numerous specific details are set forth in order to provide a more thorough understanding of the technology. However, it will be apparent to one of ordinary skill in the art that the technology may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

In general, embodiments of the technology are directed to flow balancing in a well. In particular, a well has at least one lateral. Each lateral may have multiple down hole flow control valves, and each down hole flow control valve may have a corresponding choke position. One or more embodiments determine a set of positions for the down hole flow control valves that balance flow rate for at least one lateral.

FIG. 1 depicts a schematic view, partially in cross section, of a field (100) in which one or more embodiments may be implemented. In one or more embodiments, the field may be an oilfield. In other embodiments, the field may be a different type of field. In one or more embodiments, one or more of the modules and elements shown in FIG. 1 may be omitted, repeated, and/or substituted. Accordingly, embodiments should not be considered limited to the specific arrangements of modules shown in FIG. 1.

As shown in FIG. 1, the subterranean formation (104) may include several geological structures (106-1 through 106-4) of which FIG. 1 provides an example. As shown, the formation may include a sandstone layer (106-1), a limestone layer (106-2), a shale layer (106-3), and a sand layer (106-4). A fault line (107) may extend through the formation. In one or more embodiments, various survey tools and/or data acquisition tools are adapted to measure the formation and detect the characteristics of the geological structures of the formation. Further, as shown in FIG. 1, the wellsite system (110) is associated with a rig (101), a wellbore (103), and other field equipment and is configured to perform wellbore operations, such as logging, drilling, fracturing, production, or other applicable operations. The wellbore (103) may also be referred to as a borehole.

In one or more embodiments, the surface unit (112) is operatively coupled to a field management tool (116) and/or the wellsite system (110). In particular, the surface unit (112) is configured to communicate with the field management tool (116) and/or the wellsite system (110) to send commands to the field management tool (116) and/or the wellsite system (110) and to receive data therefrom. For example, the wellsite system (110) may be adapted for measuring downhole properties using logging-while-drilling ("LWD") tools to obtain well logs and for obtaining core samples. In one or more embodiments, the surface unit (112) may be located at the wellsite system (110) and/or remote locations. The surface unit (112) may be provided with computer facilities for receiving, storing, processing, and/or analyzing data from the field management tool (116), the wellsite system (110), or another part of the field (100). The surface unit (112) may also be provided with or functionally for actuating mechanisms at the field (100). The surface unit (112) may then send command signals to the field (100) in response to data received, for example, to control and/or optimize various field operations described above.

During the various oilfield operations at the field, data is collected for analysis and/or monitoring of the oilfield operations. Such data may include, for example, subterranean formation, equipment, historical and/or other data. Static data relates to, for example, formation structure and geological stratigraphy that define the geological structures of the subterranean formation. Static data may also include data about the wellbore, such as inside diameters, outside diameters, and depths. Dynamic data relates to, for example, fluids flowing through the geologic structures of the subterranean formation over time. The dynamic data may include, for example, pressures, fluid compositions (e.g. gas oil ratio, water cut, and/or other fluid compositional information), and choke positions of down hole flow control valves, and other information that may be monitored via downhole sensors. The downhole sensors may include sensors which are part of the down hole flow control valves and sensors, e.g. pressure and temperature sensors, which are located separately in the various well zones and/or other well locations.

The static and dynamic data collected from the wellbore and the oilfield may be used to create and update a three dimensional model of the subsurface formations. Additionally, static and dynamic data from other wellbores or oilfields may be used to create and update the three dimensional model. Hardware sensors, core sampling, and well logging techniques may be used to collect the data. Other static measurements may be gathered using downhole measurements, such as core sampling and well logging techniques. Well logging involves deployment of a downhole tool into the wellbore to collect various downhole measurements, such as density, resistivity, etc., at various depths. Such well logging may be performed using, for example, a drilling tool and/or a wireline tool, or sensors located on downhole production equipment. Once the well is formed and completed, fluid flows to the surface using production tubing and other completion equipment. As fluid passes to the surface, various dynamic measurements, such as fluid flow rates, pressure, and composition may be monitored. These parameters may be used to determine various characteristics of the subterranean formation.

In one or more embodiments, the data is received by the surface unit (112), which is communicatively coupled to the field management tool (116). Generally, the field management tool (116) is configured to analyze, model, control, optimize, or perform other management tasks of the aforementioned field operations based on the data provided from the surface unit (112). Although the surface unit (112) is shown as separate from the field management tool (116) in FIG. 1, in other examples, the surface unit (112) and the field management tool (116) may also be combined.

Figure 2:
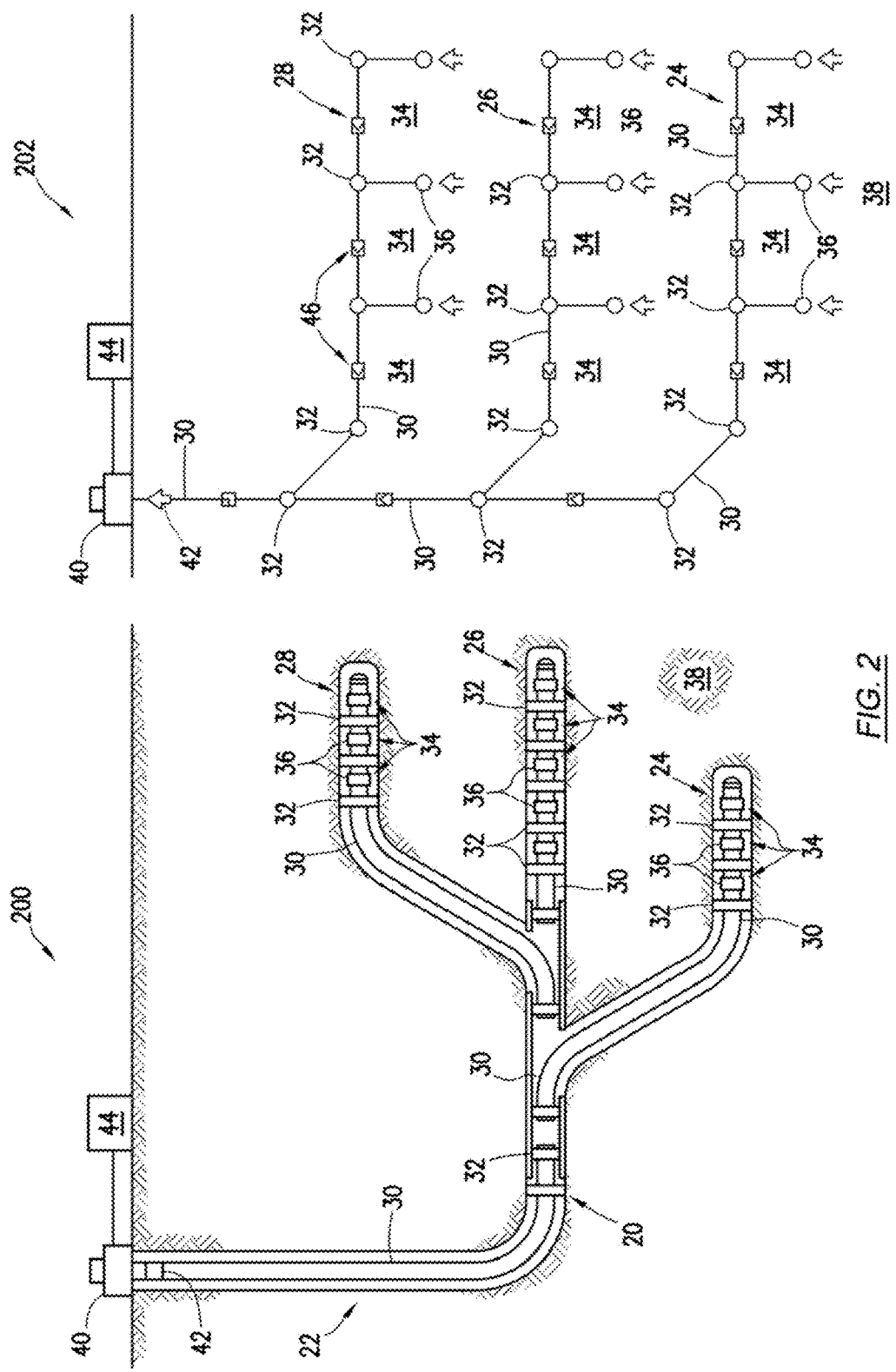

In the vertical well shown in FIG. 1, a lateral of the vertical well is the borehole. Although FIG. 1 shows a vertical well, one or more embodiments may apply to a horizontal well and/or a multilateral well that extends horizontally through one or more subsurface formations. For example, in a horizontal well, the lateral may correspond to the single borehole trajectory. The single lateral of the horizontal or vertical well may have multiple zones isolated by packers and down hole flow control valves. In a multilateral well, multiple laterals may exist. FIG. 2 shows an example of a multilateral well (200) and a corresponding well model (202) in accordance with one or more embodiments of the technology.

In FIG. 2, the left side of the figure (200) illustrates an example of an actual multilateral well (22) while the right side (202) of the figure illustrates the corresponding multilateral well model. Similar elements from the illustrated actual multilateral well completion (200) and from the multilateral well model (202) of the completion have been labeled with similar reference numerals.

In the example illustrated in FIG. 2, the multilateral well (22) comprises a multilateral well having laterals (24), (26) and (28). Each lateral corresponds to a lateral bore or a separate borehole that extends from a primary borehole. FIG. 2 is an example and the multilateral well may have other numbers and arrangements of laterals. The multilateral well may have well completion systems (20). Well completion systems may include sections of tubing (30) which extend between and/or through various completion components, including packers (32) which isolate corresponding well zones (34). In particular, a well zone is a region along a lateral that is demarcated by two adjacent packers. In one or more embodiments of the technology, the well completion system (20) may include down hole flow control valves (36) which control fluid flows and fluid flow rates from the various corresponding well zones (34) into multilateral well completion systems (20). In other words, a down hole flow control valve controls the flow from the particular zone and any prior zones. Each down hole flow control valve may have configurable choke positions that are capable of being adjusted while downhole. The choke position specifies the amount of opening of the down hole flow control valve, and, thus, the amount of fluid that is capable of being passed through the down hole flow control valve.

For example, well fluid may flow from a surrounding formation (38), e.g. a hydrocarbon fluids bearing formation, and into well completion system (20) through down hole flow control valves (36) at corresponding well zones (34). The fluid is commingled after flowing through the down hole flow control valves (36) and the commingled fluid flow is directed up through tubing sections (30) to a wellhead (40) for collection. The wellhead (40) or other surface equipment also may comprise down hole flow control equipment (42), such as a valve or other type of choking device, to control flow rates and pressures at the surface as monitored and controlled by the surface unit (44) (discussed above with reference to FIG. 1).

Continuing with FIG. 2, the multilateral well model shown on the right side (202) of FIG. 2 is constructed to represent the various components of the multilateral well (22) including, for example, the inside and outside diameters of tubing sections (30), casing perforations in a cased well, depths of components (e.g. depths of down hole flow control valves, number and position of lateral bores), well zones, reservoir properties, fluid parameters, and types of completion equipment (e.g., types of down hole flow control valves). The multilateral well model may use static and dynamic data (discussed above with reference to FIG. 1).

The multilateral well model may further model the flow of downhole fluids and gas into the laterals and through the borehole based on reservoir properties, pressures, fluid data, choke positions, and/or other inputs data to the model. Once choke positions of down hole flow control valves are implemented based on the validated optimization scenarios, the multilateral well model may be continually recalibrated, which effectively continues the optimization loop.

Figure 3:
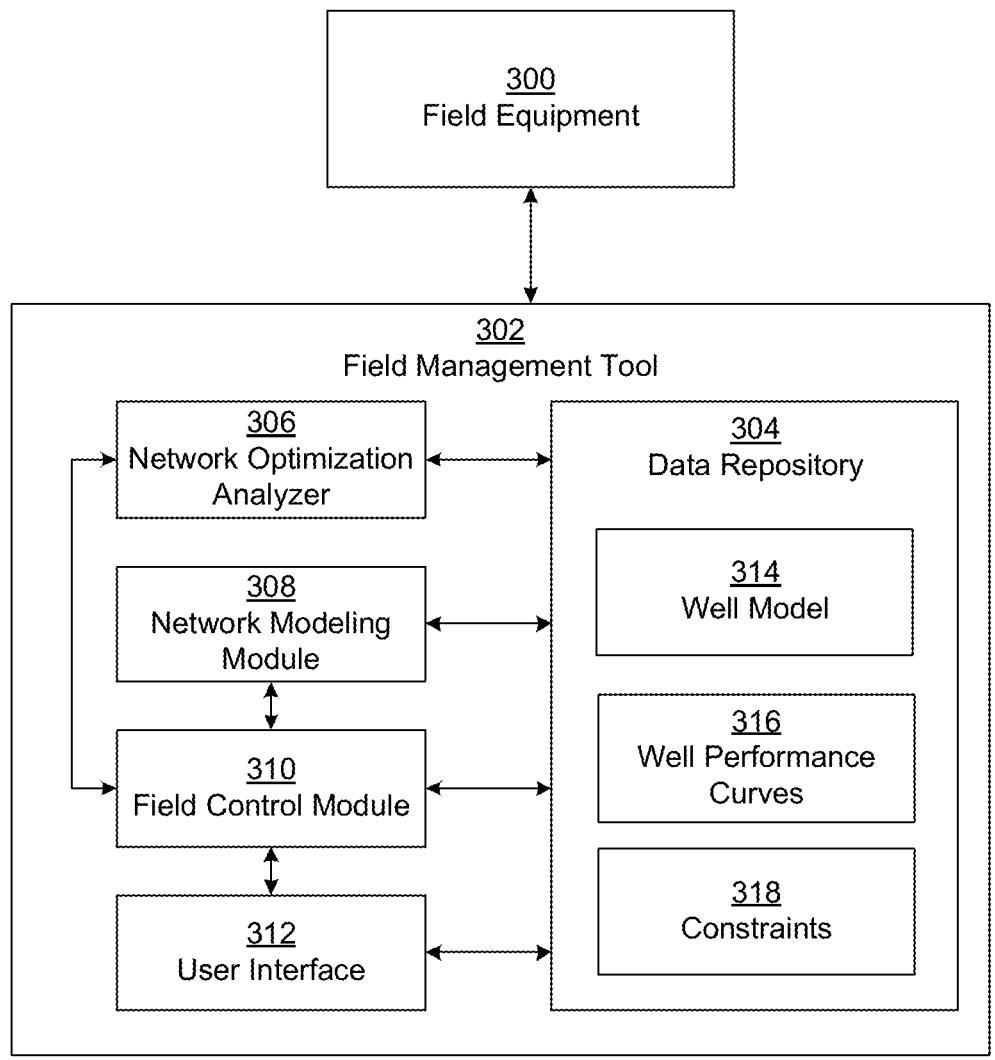

FIG. 3 shows a schematic diagram of a system in accordance with one or more embodiments of the technology. In FIG. 3, lines represent operable connections between components. In other words, the operable connections represent at least some of the components that may share data and commands. The operable connections may be direct or indirect, through a network, through shared storage, through application programming interface calls, intermittent or semi-permanent, or through any other type of connection. As shown in FIG. 3, field equipment (300) is operatively connected to a field management tool (302). The field equipment (300) may correspond to any of the hardware and other equipment discussed above with reference to FIG. 1 and the left side of FIG. 2. The field management tool (302) may correspond to the field management tool discussed above with reference to FIG. 1.

As shown in FIG. 3, the field management tool (302) includes a data repository (304), a network optimization analyzer (306), a network modeling module (308), a field control module (310), and a user interface (312). Each of these components is described below.

In one or more embodiments of the technology, the data repository (304) is any type of storage unit and/or device (e.g., a file system, database, collection of tables, or any other storage mechanism) for storing data. Further, the data repository (304) may include multiple different storage units and/or devices. The multiple different storage units and/or devices may or may not be of the same type or located at the same physical site.

The data repository (304) includes functionality to store a well model (314), well performance curves (316), and constraints (318) in accordance with one or more embodiments of the technology. In one or more embodiments of the technology, the well model (314) may correspond to the well model discussed above with reference to the right side of FIG. 2. In other words, the well model (314) is an internal representation of a well. The well model (314) may further include information about the surrounding formation.

In one or more embodiments of the technology, the well performance curves (316) are a set of functions that map pressure with flow rates for a corresponding choke position of a down hole flow control valve. In other words, each down hole flow control valve may have a separate set of well performance curves defined for the down hole flow control valve. Each well performance curve in the set of well performance curves may correspond to a separate choke position. In other words, a distinct well performance curve may exist for each choke position in accordance with one or more embodiments of the technology.

A well performance curve corresponds to any type of function, continuous or discrete. For example, a well performance curve may correspond to a set of data points that map the pressures to the corresponding flow rates. By way of another example, a well performance curve may correspond to a continuous function, such as a function determined from linear regression of multiple data points. Further, each well performance curve may be maintained and used using virtually any type of data structure.

Continuing with FIG. 3, constraints (318) are a set of limitations on an optimization problem. The constraints may be defined as an inequality or an equality equation. For example, the optimization problem has at least one objective function (not shown), such as maximization of oil and/or minimization of water and gas production. The objective function is a mathematical formula specifying the desired result. The constraints are limitations that should be satisfied in determining the value of the objective function. For example, the constraints may be limitations regarding draw down, bubble point, flow balance, and flow rate restriction. In one or more embodiments of the technology, at least one constraint is a balancing condition for at least one lateral. In particular, the balancing condition may be that a value of a property at the down hole flow control valves in a lateral are within a threshold difference from each other when the choke positions are set. The threshold difference may be zero, in which case the value of the property is equal for each of the down hole flow control valves within a lateral. In other embodiments, the threshold difference may be greater than zero to allow for a margin of error or reduce the time to solve the optimization problem. For example, the property subject to the balance condition may be water and/or gas break through, pressure, oil and/or gas production rate, or another property. Further, a property is a property of the down hole flow control valve when the property is dependent on the choke position of the down hole flow control valve. For example, the property may be a property of the zone in which the down hole flow control valve is located.

In one or more embodiments of the technology, the balancing conditions may apply to multiple laterals of a multilateral well. In such a scenario, each lateral may be balanced individually. In other words, the values of the property of down hole flow control valves within the lateral may be balanced while the values for different laterals are not balanced. In other embodiments, the balancing condition may be that the values of the property are balanced across multiple laterals.

Continuing with FIG. 3, the network optimization analyzer (306) corresponds to hardware, software, firmware, or a combination thereof that includes functionality to solve an optimization problem having at least one objective function and constraints (318). In one or more embodiments, the network optimization analyzer (306) is configured to use, as a set of inputs, a well performance curve for each down hole flow control valve, and generate, as a set of outputs, the choke position for each down hole flow control valve as specified by solving the optimization problem. In one or more embodiments of the technology, the network optimization analyzer (306) may be further configured to solve the network optimization problem based on the configuration of the well.

In one or more embodiments of the technology, the network modeling module (308) corresponds to hardware, software, firmware, or a combination thereof that includes functionality to determine a set of pressures corresponding to the down hole flow control valve given a set of choke positions for the down hole flow control valves. In one or more embodiments, the network modeling module (308) may be a repurposed tool that generally simulates flow through a surface network having multiple wells. In other words, the network modeling module (308) may be designed for a surface network simulation. In such a scenario, when input into the network modeling module (308), the down hole flow control valves may each be identified as individual wells to the network modeling module and the choke positions may be identified as choke positions for the well heads. In other embodiments, the network modeling module (308) may be designed for a well.

In one or more embodiments of the technology, the data repository (304), the network optimization analyzer (306), and the network modeling module (308) are operably connected to a field control module (310). The field control module (310) includes functionality to orchestrate the flow balancing for a well. For example, the field control module (310) may include functionality to generate or otherwise obtain well performance curves, the well model, and constraints. The field control module (310) may be further configured to select pressures, select corresponding well performance curves, and initiate the operations of the network optimization analyzer and the network modeling module. In one or more embodiments of the technology, the field control module (310) may further include functionality to obtain results of processing and send commands to the field equipment. In other words, the field control module (310) may include functionality to control the equipment at the field, with or without human interaction.

In one or more embodiments of the technology, the user interface (312) is connected to the field control module (310), and may be configured to interact with a user. For example, the user interface may be a graphical user interface. Further, the user interface (312) may include functionality to receive information about constraints, the well, and other aspects of the field operations. The user interface may further be configured to display output of the network optimization analyzer, the network modeling module, the field control module, or a combination thereof.

Figure 4:
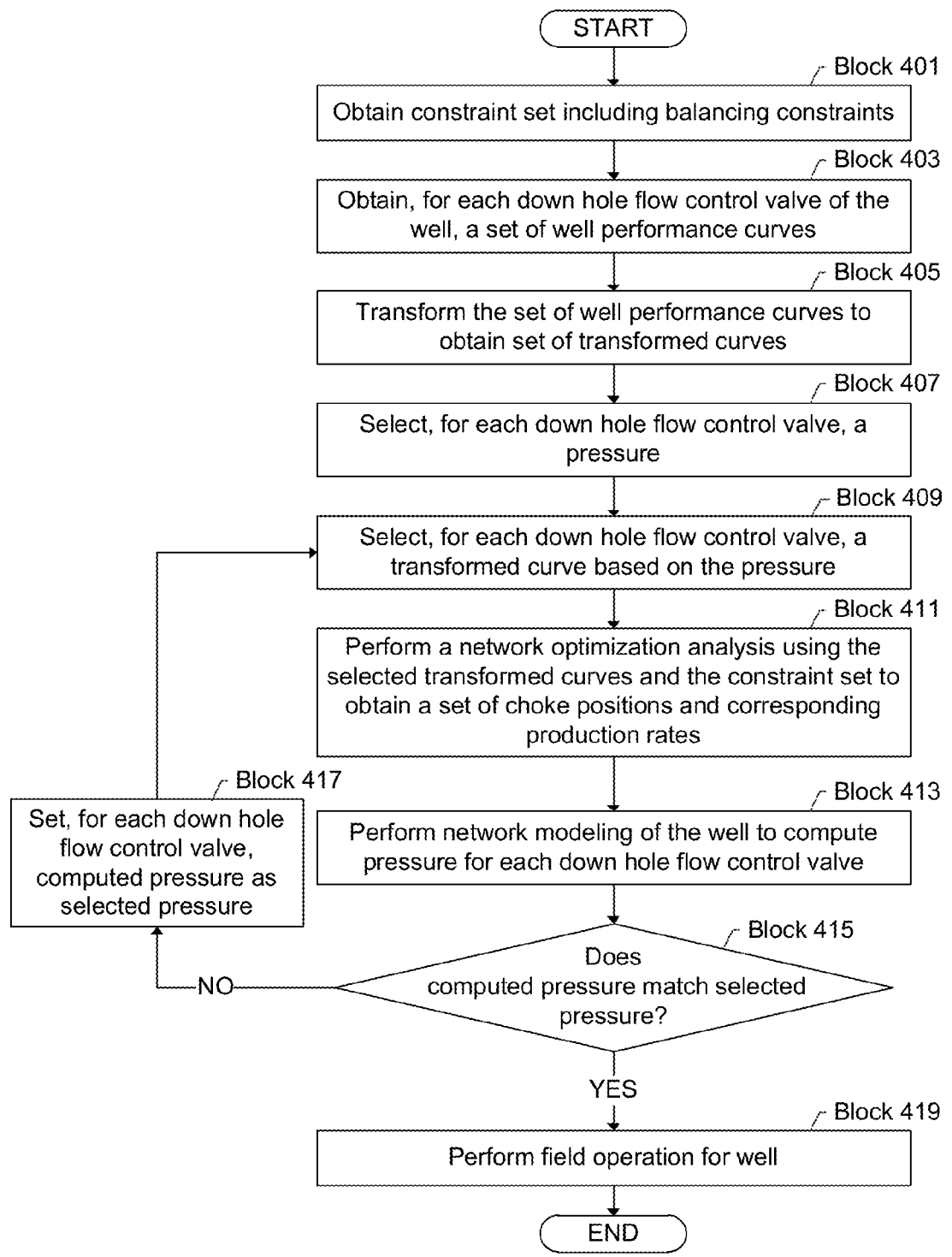
FIG. 4 shows a flowchart in accordance with one or more embodiments of the technology.

FIG. 4 shows a flowchart in accordance with one or more embodiments of the technology. While the various blocks in this flowchart are presented and described sequentially, one of ordinary skill will appreciate that at least some of the blocks may be executed in different orders, may be combined or omitted, and at least some of the blocks may be executed in parallel. Furthermore, the blocks may be performed actively or passively. For example, some blocks may be performed using polling or be interrupt driven in accordance with one or more embodiments of the technology. By way of an example, determination blocks may not require a processor to process an instruction unless an interrupt is received to signify that condition exists in accordance with one or more embodiments of the technology. As another example, determination blocks may be performed by performing a test, such as checking a data value to test whether the value is consistent with the tested condition in accordance with one or more embodiments of the technology.

In Block 401, a constraint set that includes balancing conditions is obtained in accordance with one or more embodiments of the technology. For example, the constraint set may be obtained through the graphical user interface with the user. In other words, the user may submit, using various graphical user interface widgets, particular well specific and/or company specific parameters defining the constraints on the well. In one or more embodiments of the technology, the constraints may be provided using mathematical notation (e.g., in free form) or via a simplified user interface. For example, the user may select various drop down boxes that provide menu options for selecting the constraints. In some embodiments, the field management tool may be preconfigured with a set of constraints. For example, the field management tool may be provided with a set of default constraints that may be edited, deleted, and/or supplemented by the user.

In Block 403, for each down hole flow control valve of the well, a set of well performance curves is obtained in accordance with one or more embodiments of the technology. In one or more embodiments of the technology, pressure and temperature data, down hole flow control valve choke positions, flow rate data, and other information may be acquired from downhole sensors. Similarly, other information may be obtained from sensors at the oilfield or another location. Additionally, the structure of the well completion may be determined by, for example, obtaining a well completion schematic showing the arrangement of down hole flow control valves. The various items of data may be related into data points and regression analysis may be performed to generate the well performance curves. Other techniques for generating the well performance curves may be used without departing from the scope of the technology.

In Block 405, the set of well performance curves are transformed to obtain a set of transformed curves (i.e., transformed well performance curves). The transforming operation changes, for each down hole flow control valve, the set of curves from having a curve for each choke position that maps pressure to flow rate to a having a curve for each pressure that maps choke position to flow rate. Performing the transformation operation may include identifying a set of pressures, and for each pressure in the set, obtaining the flow rates and corresponding choke positions for the pressure. Various mechanisms for performing the transformation may be used without departing from the scope of the technology.

In Block 407, for each down hole flow control valve, a pressure is selected in accordance with one or more embodiments of the technology. Various techniques and information may be used in selecting the initial pressure. For example, the pressure may be initially selected randomly or based on similar down hole flow control valves in similar wells. As another example, an end user may, using the user interface, select the initial pressure. Further, the pressure may be selected individually for each separate down hole flow control valve, separately for subsets of down hole flow control valves, or jointly for the down hole flow control valves in the well.

In Block 409, for each down hole flow control valve, a transformed curve is selected based on the pressure in accordance with one or more embodiments of the technology. The transformed curve is selected based on matching the selected pressure. If a pressure is selected that does not match an existing transformed curve, then selecting a transformed curve may be performed by estimating a transformed curve based on the existing set of curves.

In Block 411, a network optimization analysis is performed using the selected transformed curves and the constraint set to obtain a set of choke positions and corresponding production rates in accordance with one or more embodiments of the technology. For example, the field control module may send the transformed curves and the constraint set to the network analysis module. The network analysis module may use various techniques for solving optimization problems to determine and output a set of choke positions. Further, the network analysis module may output the result of the objective function and/or the various production rates.

In Block 413, network modeling of the well is performed to compute pressure for each down hole flow control valve in accordance with one or more embodiments of the technology. In one or more embodiments, the pressure selected in Block 407 is a rough estimated pressure. In one or more embodiments of the technology, the network modeling module uses the set of choke positions to simulate the movement of matter (e.g., hydrocarbons, water, and other matter) through the well in order to determine the simulated computed pressure at each down hole flow control valve. Thus, the computed pressure may be more accurate than the selected pressure in Block 407. In one or more embodiments of the technology, the field management tool may call the network modeling module with the set of choke positions and flow rates as input. In some embodiments, the network modeling module may treat the network as a surface network when performing the respective simulations to output the set of computed pressures for the down hole flow control valves.

In Block 415, a determination is made whether the computed pressures match the selected pressures for the down hole flow control valve. In other words, a determination is made whether, for each down hole flow control valve, the computed pressure is within a threshold of the selected pressure. If the computed pressure is not within the threshold of the selected pressure, then the prior selected pressure may not be accurate, and the flow may proceed to Block 417.

In Block 417, for each down hole flow control valve, the computed pressure is set as the selected pressure for the next iteration of processing in accordance with one or more embodiments of the technology. Thus, another set of pressures is selected. The flow may then repeat with Block 409 to use the computed pressures to select another set of transformed curves. Thus, Blocks 409-417 may repeat until the computed pressure is determined to match the selected pressure in Block 415.

If the computed pressure matches the selected pressure in Block 415, the flow may proceed to Block 419. In Block 419, a field operation of the well is performed in accordance with one or more embodiments of the technology. In one or more embodiments of the technology, performing the field operation may include sending a control signal to the field equipment, such as one or more down hole flow control valves to change the choke positions on the down hole flow control valves. For example, the field control module may send the control signal, directly or indirectly with or without human intervention and modification, to the down hole flow control valves. In some embodiments, performing the field operation may include displaying the set of choke positions in a user interface for a user to implement. Performing the field operation may include storing the set of choke positions for further analysis and simulation.

Although not presented in FIG. 4, the process of FIG. 4 may be repeated at different points in time using different sets of well performance curves in order to optimize the well over a span of times. In performing the optimization over time, additional constraints may be applied, such as to delay water breakthrough or have other conditions be delayed.

FIGS. 5.1, 5.2, 5.3, and 5.4 show an example in accordance with one or more embodiments of the technology. The example is for explanatory purposes and not intended to limit the scope of the technology. Other embodiments of the technology may deviate from the example.

FIG. 5.1 shows an example graph (500) of well performance curves in accordance with one or more embodiments of the technology. At any particular point in time, the production characteristics of a well may be considered to be constant. The production characteristics may include the fluid properties such as the gas oil ratio and water cut, the reservoir pressure and the productivity index. In such a scenario, the down hole flow control valve may be assumed to have one input (valve opening) and one output (produced liquid). The combination of the control valve and the production characteristics for the well may be modeled as a simple single point completion style of well in a wellbore simulator. Based on the simulations, for each of the simulated wells, which corresponds in actuality to a down hole flow control valve of the well, a performance curve (e.g., performance curve (502)) may be computed as shown in example FIG. 5.1. In the example, each well performance curve indicates the output production liquid flow rate versus the pressure for a particular input opening or choke position for the down hole flow control valve. In other words, each well performance curve corresponds to a choke position as shown by a key (504). As shown in FIG. 5.1, a set of well performance curves may be computed for a set of openings of the down hole inflow control valve at the point where the flow joins the well lateral branch. For a given value of the opening of the down hole inflow control valve, a higher value of the downstream flowing pressure results in a smaller production liquid flow rate as shown in the example graph (500).

Turning to FIG. 5.2, FIG. 5.2 shows an example graph (510) of transformed well performance curves for a particular down hole flow control valve. As shown in FIG. 5.2, the transformed well performance curves include a transformed well performance curve (e.g., transformed well performance curve (512)) for multiple pressures. In other words, as defined by the key (514), a distinct transformed well performance curve may exist for each of multiple pressures, whereby the well performance curve maps choke positions to flow rates for a given pressure.

Using the transformed well performance curves, an optimization problem may be solved. For example, the optimization problem may be of the following form.

$$\min \sum_{i=1}^{M} \sum_{j=1}^{N} G_{i,j}(B_{i,j}) \quad \text{(Eq 2a)}$$

Subject to the constraint $$\sum_{i=1}^{M} \sum_{j=1}^{N} O_{i,j}(B_{i,j}) = O_{targ} \quad \text{(Eq 2b)}$$

In the above optimization problem, $B_{i,j}$ denotes the position for the down hole inflow control valve for zone i in lateral j:i=1, . . . , Mj and j=1, . . . , N; $Q_{i,j}(B_{i,j})$ denotes the oil production rate from zone i in lateral j:i=1, . . . ,Mj; and j=1, . . . , N; $G_{i,j}(B_{i,j})$ denotes the gas production rate from zone i in lateral j:i=1, . . . , Mj and j=1, . . . , N; $W_{i,j}(B_{i,j})$ denotes the water production rate from zone i in lateral j:i=1, . . . , Mj and j=1, . . . , N; and $O_{targ}$ denotes the system wide target oil production rate. Using the transformed performance curve for each zone at the outlet pressure Pw and the target oil production rate, $O_{targ}$, a set of down hole inflow control valve positions, Bn that maximize the overall network oil production rate may be provided by the solution to the above optimization problem.

As the reservoir depletes, then the reservoir conditions and reservoir fluid properties may change. Thus, as new data becomes available, the optimization problem may be recalculated to determine a new set of choke positions for down hole flow control valves. The optimization problem formulation above may simply close the down hole inflow control valves connected to the zones with the highest values of the gas oil ratio. Thus, a potential exists for the producing zones in a lateral to see an increase in the gas oil ratio of the produced fluid between sampling periods which in turn can lead to the new control valves positions for these previously open valves being closed for the next period. Conversely, the previous closed down hole inflow control valves will now be open. FIG. 5.3 shows an example graph (520) of the possible resulting oscillatory behavior. In FIG. 5.3, the x-axis (522) shows time and the y-axis (524) shows the choke position for each corresponding down hole flow control valve.

In order to reduce the oscillatory behavior, a balancing constraint may be applied to the above optimization problem. For example, the balancing condition may be of the following form.

$$E_{G_j} = 0.0 \quad \text{(Eq 2c)}$$

Where:

$$\overline{G}_{i,j} = \frac{\sum_{i=1}^{M_j} G_{i,j}(B_{i,j})}{M_j} \quad \text{(Eq 2d)}$$

$$E_{G_j} = \sum_{i=1}^{M_j} \frac{\overline{G}_{i,j}(B_{i,j}) - \overline{G}_{i,i}}{\overline{G}_{i,j}} \quad \text{(Eq 2e)}$$

In the above balancing constraint, $\overline{G}_{i,j}$ denotes the target balanced gas production for each zone i in lateral j:i=1, ..., Mj and j=1, ..., N; and $E_{G_j}$ denotes the sum of the fractional gas production rate imbalances for lateral j:j=1, ..., N. In one or more embodiments, application of a strict balance to the gas flow for each lateral may be computationally slow to solve. Thus, a threshold difference may be used to increase the computational speed of the calculation. For example, a tolerance of 10% or other suitable value is applied to the evaluation of equation 2e. More specifically, errors for the zones in which error is outside of this tolerance are included in the evaluation. Repeating the same simulation discussed above with reference to FIG. 5.3 but using the additional balancing constraint, a simulation may be performed as shown in FIG. 5.4. In particular, FIG. 5.4 shows an example graph (530) of the possible smoothing behavior caused by adding the additional balancing constraint. In FIG. 5.4, the x-axis (533) shows time and the y-axis (534) shows the choke position for each corresponding down hole flow control valve. As shown in FIG. 5.4, the oscillatory behavior is not as strong as in FIG. 5.3.

Similarly, the onset of water breakthrough may be delayed by adding the following balancing constraint.

$$E_{W_j} = 0.0 \quad \text{(Eq 2f)}$$

Where:

$$\overline{W}_{i,j} = \frac{\sum_{i=1}^{M_j} W_{i,j}(B_{i,j})}{M_j} \quad \text{(Eq 2g)}$$

$$E_{W_j} = \sum_{i=1}^{M_j} \frac{\overline{W}_{i,j}(B_{i,j}) - \overline{W}_{i,i}}{\overline{W}_{i,j}} \quad \text{(Eq 2h)}$$

In the above balancing constraint, $\overline{W}_{i,j}$ denotes the target balanced water production for each zone i in lateral j:i=i=1, ..., Mj and j=1, ..., N; and $E_{W_j}$ denotes the sum of the fractional water production rate imbalances for lateral j:j=1, ..., N. This formulation may exhibit a smoother progression of the valves positions between sampling points. In other words, the balancing constraint may damp the changes over time.

The down hole flow control valve settings may be adjusted repeatedly based on episodic or real time processing of data. The procedure for down hole flow control valve setting can be adapted to many types of multizone/well completions having an individual lateral bore or various numbers, arrangements, and sizes of lateral bores by providing the appropriate completion system data for the network model. Accordingly, the down hole flow control valve setting procedure may be used in many types of wells, environments, and completions.

Although a few embodiments of the disclosure have been described in detail above, those of ordinary skill in the art will readily appreciate that many modifications are possible without materially departing from the teachings of this disclosure. Accordingly, such modifications are intended to be included within the scope of this disclosure as defined in the claims.

Figure 6:
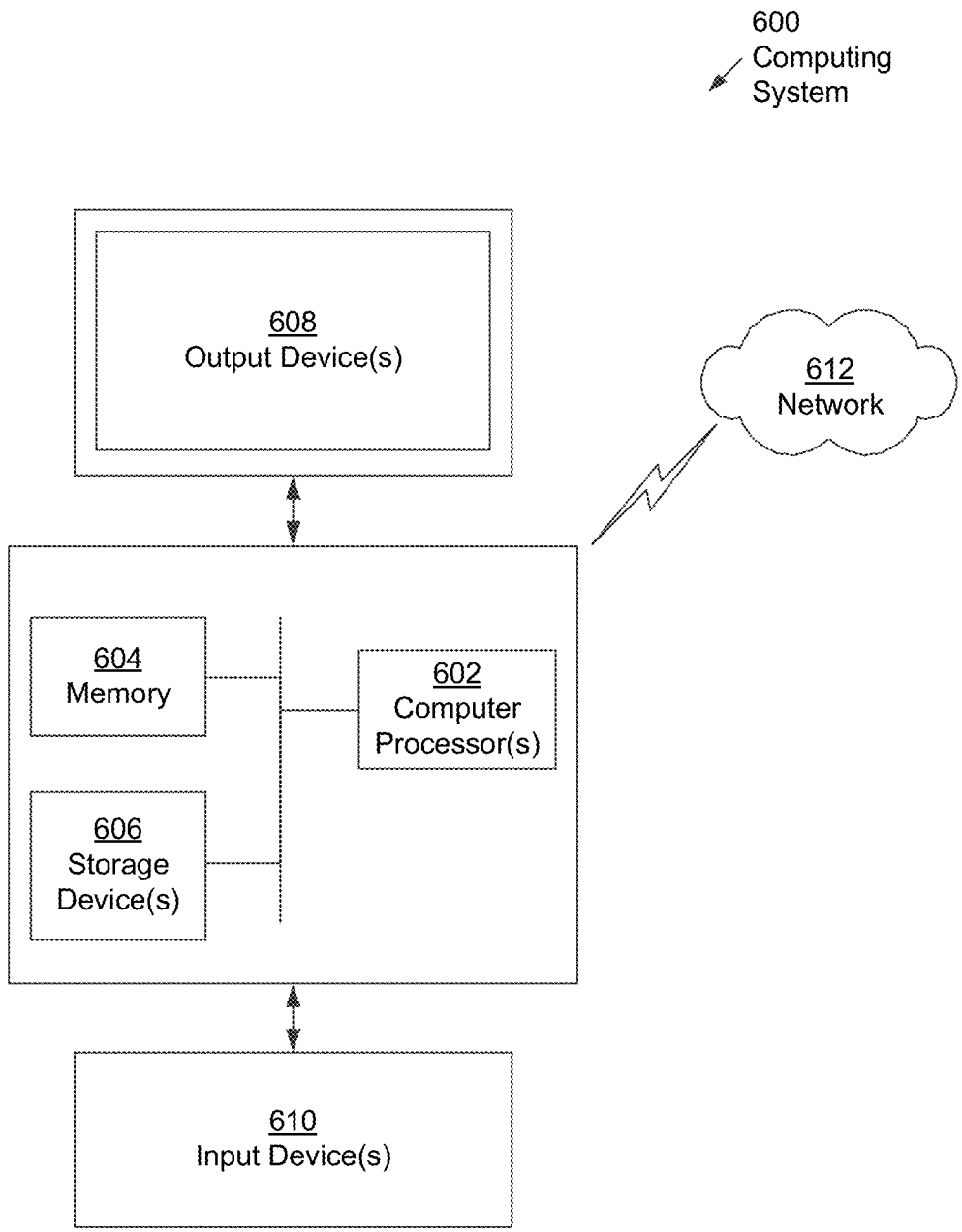
FIG. 6 shows a computing system in accordance with one or more embodiments of the technology.

Embodiments of the technology may be implemented on a computing system. Any combination of mobile, desktop, server, embedded, or other types of hardware may be used. For example, as shown in FIG. 6, the computing system (600) may include one or more computer processor(s) (602), associated memory (604) (e.g., random access memory (RAM), cache memory, flash memory, etc.), one or more storage device(s) (606) (e.g., a hard disk, an optical drive such as a compact disk (CD) drive or digital versatile disk (DVD) drive, a flash memory stick, etc.), and numerous other elements and functionalities. The computer processor(s) (602) may be an integrated circuit for processing instructions. For example, the computer processor(s) may be one or more cores, or micro-cores of a processor. The computing system (600) may also include one or more input device(s) (610), such as a touchscreen, keyboard, mouse, microphone, touchpad, electronic pen, or any other type of input device. Further, the computing system (600) may include one or more output device(s) (608), such as a screen (e.g., a liquid crystal display (LCD), a plasma display, touchscreen, cathode ray tube (CRT) monitor, projector, or other display device), a printer, external storage, or any other output device. One or more of the output device(s) may be the same or different from the input device(s). The computing system (600) may be connected to a network (612) (e.g., a local area network (LAN), a wide area network (WAN) such as the Internet, mobile network, or any other type of network) via a network interface connection (not shown). The input and output device(s) may be locally or remotely (e.g., via the network (612)) connected to the computer processor(s) (602), memory (604), and storage device(s) (606). Many different types of computing systems exist, and the aforementioned input and output device(s) may take other forms.

Software instructions in the form of computer readable program code to perform embodiments of the technology may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that when executed by a processor(s), is configured to perform embodiments of the technology.

Further, one or more elements of the aforementioned computing system (600) may be located at a remote location and connected to the other elements over a network (612). Further, embodiments of the technology may be implemented on a distributed system having a plurality of nodes, where each portion of the technology may be located on a different node within the distributed system. In one embodiment of the technology, the node corresponds to a distinct computing device. The node may correspond to a computer processor with associated physical memory. The node may correspond to a computer processor or micro-core of a computer processor with shared memory and/or resources.

While the technology has been described with respect to a limited number of embodiments, those skilled in the art, having benefit of this disclosure, will appreciate that other embodiments can be devised which do not depart from the scope of the technology as disclosed herein. Accordingly, the scope of the technology should be limited only by the attached claims.

What is claimed is:

1. A method for flow balancing, the method comprising:
   selecting, for each of a plurality of down hole flow control valves of a well, a transformed well performance curve corresponding to a first down hole flow control valve pressure to obtain a plurality of transformed well performance curves, wherein the well comprises a lateral comprising the plurality of down hole flow control valves;
   performing, using a constraint set comprising a balancing condition for the lateral, a network optimization analysis on the plurality of transformed well performance curves to generate a set of choke positions corresponding to each down hole flow control valve of the plurality of down hole flow control valves;
   performing network modeling of the well based on the set of choke positions to obtain a second down hole flow control valve pressure for each down hole flow control valve of the plurality of down hole flow control valves; and
   performing a field operation for the well using the set of choke positions based on the second down hole flow control valve pressure being within a threshold difference of the first down hole flow control valve pressure for each down hole flow control valve of the plurality of down hole flow control valves.

2. The method of claim 1, further comprising:
   selecting an initial down hole flow control valve pressure for each down hole flow control valve of the plurality of down hole flow control valves,
   wherein selecting the transformed well performance curve, performing the network optimization analysis, and performing the network modeling is performed iteratively starting with the initial down hole flow control valve pressure until the second down hole flow control valve pressure is within the threshold difference of the first down hole flow control valve pressure for each down hole flow control valve.

3. The method of claim 1, further comprising:
   for each down hole flow control valve:
      obtaining a plurality of well performance curves mapping pressure to flow rate, wherein each well performance curve of the plurality of well performance curves corresponds to a choke position of a plurality of choke positions; and
      transforming the plurality of well performance curves into a set of transformed well performance curves for the down hole flow control valve, wherein each transformed well performance curve for the down hole flow control valve maps flow rates to choke positions and corresponds to a particular pressure,
   wherein the transformed well performance curve for each down hole flow control valve is selected from the set of transformed well performance curves for the down hole flow control valve.

4. The method of claim 1, wherein performing the field operation comprises sending a control signal to a down hole flow control valve of the plurality of down hole flow control valves to change a choke position of the down hole flow control valve.

5. The method of claim 1, wherein performing the field operation comprises displaying the set of choke positions on a graphical user interface.

6. The method of claim 1, wherein the balancing condition comprises each down hole flow control valve within the lateral having a flow rate within a flow rate threshold of each other down hole flow control valve within the lateral.

7. The method of claim 1, wherein the constraint set further comprises at least one selected from a group consisting of a constraint to delay breakthrough of water and a constraint to minimize breakthrough of water.

8. The method of claim 1, wherein the constraint set further comprises at least one selected from a group consisting of a constraint to delay breakthrough of gas and a constraint to minimize breakthrough of gas.

9. The method of claim 1, further comprising: repetitively selecting the transformed well performance curve, performing the network optimization analysis, and performing the network modeling for a plurality of times to determine the set of choke positions for the plurality of times.

10. A system for flow balancing comprising:
    a data repository for storing:
       a well model for a well, the well comprising a lateral comprising a plurality of down hole flow control valves, and
       a constraint set comprising a balancing condition for the lateral; and
    a computer processor, operatively connected to the data repository, for executing:
       a field control module that:
          selects, for each of the plurality of down hole flow control valves, a transformed well performance curve corresponding to a first down hole flow control valve pressure to obtain a plurality of transformed well performance curves, and
          performs a field operation for the well using a set of choke positions based on a second down hole flow control valve pressure being within a threshold difference of the first down hole flow control valve pressure for each down hole flow control valve of the plurality of down hole flow control valves,
       a network optimization analyzer, operatively connected to the field control module, that:
          performs a network optimization analysis on the plurality of transformed well performance curves to generate the set of choke positions corresponding to each down hole flow control valve of the plurality of down hole flow control valves, and
       a network modeling module, operatively connected to the field control module, that:
          performs network modeling of the well based on the set of choke positions to obtain the second down hole flow control valve pressure for each down hole flow control valve of the plurality of down hole flow control valves.

11. The system of claim 10, further comprising:
    field equipment for
       receiving, from the field control module, a control signal to a down hole flow control valve of the plurality of down hole flow control valves to change a choke position of the down hole flow control valve, and
       changing the choke position of the down hole flow control valve.

12. The system of claim 10, wherein the computer processor further executes:

a user interface for displaying the set of choke positions, wherein the user interface receives the set of choke positions from the field control module.

13. A non-transitory computer readable medium for flow balancing, the non-transitory computer readable medium comprising computer readable program code for:
selecting, for each of a plurality of down hole flow control valves of a well, a transformed well performance curve corresponding to a first down hole flow control valve pressure to obtain a plurality of transformed well performance curves, wherein the well comprises a lateral comprising the plurality of down hole flow control valves;
performing, using a constraint set comprising a balancing condition for a lateral of the plurality of laterals, a network optimization analysis on the plurality of transformed well performance curves to generate a set of choke positions corresponding to each down hole flow control valve of the plurality of down hole flow control valves;
performing network modeling of the well based on the set of choke positions to obtain a second down hole flow control valve pressure for each down hole flow control valve of the plurality of down hole flow control valves; and
performing a field operation for the well using the set of choke positions based on the second down hole flow control valve pressure being within a threshold difference of the first down hole flow control valve pressure for each down hole flow control valve of the plurality of down hole flow control valves.

14. The non-transitory computer readable medium of claim 13, further comprising computer readable program code for:
selecting an initial down hole flow control valve pressure for each down hole flow control valve of the plurality of down hole flow control valves,
wherein selecting the transformed well performance curve, performing the network optimization analysis, and performing the network modeling is performed iteratively starting with the initial down hole flow control valve pressure until the second down hole flow control valve pressure is within the threshold difference of the first down hole flow control valve pressure for each down hole flow control valve.

15. The non-transitory computer readable medium of claim 13, further comprising computer readable program code for:
for each down hole flow control valve:
obtaining a plurality of well performance curves mapping pressure to flow rate, wherein each well performance curve of the plurality of well performance curves corresponds to a choke position of a plurality of choke positions; and
transforming the plurality of well performance curves into a set of transformed well performance curves for the down hole flow control valve, wherein each transformed well performance curve for the down hole flow control valve maps flow rates to choke positions and corresponds to a particular pressure,
wherein the transformed well performance curve for each down hole flow control valve is selected from the set of transformed well performance curves for the down hole flow control valve.

16. The non-transitory computer readable medium of claim 13, wherein performing the field operation comprises displaying the set of choke positions on a graphical user interface.

17. The non-transitory computer readable medium of claim 13, wherein the balancing condition comprises each down hole flow control valve within the lateral having a flow rate within a flow rate threshold of each other down hole flow control valve within the lateral.

18. The non-transitory computer readable medium of claim 13, wherein the constraint set further comprises at least one selected from a group consisting of a constraint to delay breakthrough of water and a constraint to minimize breakthrough of water.

19. The non-transitory computer readable medium of claim 13, wherein the constraint set further comprises at least one selected from a group consisting of a constraint to delay breakthrough of gas and a constraint to minimize breakthrough of gas.

20. The non-transitory computer readable medium of claim 13, further comprising computer readable program code for repetitively selecting the transformed well performance curve, performing the network optimization analysis, and performing the network modeling for a plurality of times to determine the set of choke positions for the plurality of times.

* * * * *